(12) United States Patent  (10) Patent No.: US 8,390,388 B1
Hoffmann et al.  (45) Date of Patent: Mar. 5, 2013

(54) DIFFERENTIAL CANCELLATION OF VIBRATION INTERFERENCE IN OSCILLATORS

(75) Inventors: Ted J. Hoffmann, Hiawatha, IA (US); Jonathan A. Lovseth, Marion, IA (US); Vadim Olen, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 14 days.

(21) Appl. No.: 13/211,857

(22) Filed: Aug. 17, 2011

(51) Int. Cl.
 *H03B 5/30* (2006.01)
(52) U.S. Cl. .......................... 331/154; 331/162; 331/46
(58) Field of Classification Search .............. 331/37–43, 331/46, 47, 56, 73, 160, 162, 154
See application file for complete search history.

(56) References Cited

U.S. PATENT DOCUMENTS

| | | | |
|---|---|---|---|
| 2002/0084875 A1* | 7/2002 | Tsai et al. ..................... | 333/204 |
| 2007/0063779 A1* | 3/2007 | Kanda et al. .................. | 331/167 |

OTHER PUBLICATIONS

Agrawal et al, Electrically coupled MEMS oscillators, May 2-5, 2011, Frequency Control and the European Frequency and Time Forum (FCS) 2011 Joint Conference of the IEEE International, , 1-5.*

* cited by examiner

*Primary Examiner* — Ryan Johnson
*Assistant Examiner* — Christian L Rivera
(74) *Attorney, Agent, or Firm* — Donna P. Suchy; Daniel M. Barbieri

(57) ABSTRACT

The present invention is an oscillator which implements matched resonators which are driven at a same frequency, one hundred-eighty degrees out-of-phase. The resonators may be implemented in a same plane of a printed circuit board and located adjacent to each other, thus the resonators are affected by a same (ex.—same magnitude of) vibration interference. However, in the oscillator embodiments described herein, the vibration interference component cancels out of (ex.—is eliminated from) the oscillator output signal, leaving only the desired component.

9 Claims, 3 Drawing Sheets

DIFFERENTIAL CANCELLATION OF VIBRATION INTERFERENCE IN OSCILLATORS

FIELD OF THE INVENTION

The present invention relates to the field of oscillators and particularly to system(s) and method(s) for providing differential cancellation of vibration interference in oscillators.

BACKGROUND OF THE INVENTION

Currently available oscillators may not provide a desired level of performance and may provide signals with an undesirable level of phase noise.

Thus, it would be desirable to provide an oscillator which obviates problems associated with current solutions.

SUMMARY OF THE INVENTION

Accordingly, an embodiment of the present invention is directed to an oscillator, including: a first amplifier, the first amplifier being configured for outputting a first amplifier output signal; a first resonator, the first resonator being connected to the first amplifier, the first resonator being configured for receiving the first amplifier output signal, the first amplifier output signal causing the first resonator to oscillate and to generate a first resonator output signal; a second amplifier, the second amplifier being configured for outputting a second amplifier output signal; and a second resonator, the second resonator being connected to the second amplifier, the second resonator being configured for receiving the second amplifier output signal, the second amplifier output signal causing the second resonator to oscillate and to generate a second resonator output signal, wherein the first amplifier is an inverting amplifier and the first resonator and the second resonator are driven at a same frequency and one hundred-eighty degrees out-of-phase with respect to each other.

Accordingly, an embodiment of the present invention is directed to an oscillator, including: a first amplifier, the first amplifier being configured for outputting a first amplifier output signal and a second amplifier output signal; a routing device, the routing device being connected to the first amplifier and being configured for receiving the first and second amplifier output signals, the routing device configured for splitting the first amplifier output signal to provide a first routing device output signal and a second routing device output signal, the routing device further configured for splitting the second amplifier output signal to provide a third routing device output signal and a fourth routing device output signal; a first resonator, the first resonator being connected to the routing device via a first set of transmission lines, the first resonator being configured for receiving the first and second routing device output signals, the first and second routing device output signals causing the first resonator to oscillate and to generate a first resonator output signal; and a second resonator, the second resonator being connected to the routing device via a second set of transmission lines, the second resonator being configured for receiving the third and fourth routing device output signals, the third and fourth routing device output signals causing the second resonator to oscillate and to generate a second resonator output signal, wherein the oscillator is a differential oscillator and implements switching of the first set of transmission lines for providing inversion, the first resonator and the second resonator being driven at a same frequency and one hundred-eighty degrees out-of-phase with respect to each other.

A further embodiment of the present invention is directed to a method for providing an output signal via an oscillator, said method including: providing a first amplifier output signal from a first amplifier of the oscillator to a first resonator of the oscillator, the first amplifier being an inverting amplifier; providing a second amplifier output signal from a second amplifier of the oscillator to a second resonator of the oscillator, the first resonator and the second resonator being established in a same plane of a printed circuit board and being located adjacent to each other in the printed circuit board; generating a first resonator output signal via the first resonator based on oscillation of the first resonator caused by the first amplifier output signal; generating a second resonator output signal via the second resonator based on oscillation of the second resonator caused by the second amplifier output signal; deriving an oscillator output signal based on the first resonator output signal and the second resonator output signal, wherein a vibration noise component of the first resonator output signal and a vibration noise component of the second resonator output signal offset, such that the oscillator output signal has mitigated vibration noise; amplifying the oscillator output signal via a buffer amplifier of the oscillator; and providing the amplified oscillator output signal to a load, said load being connected to the oscillator.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Reference oscillators are the foundation for frequency synthesis in all radio systems. Oscillators determine frequency accuracy (ex.—centering the radio on a channel) and impact phase noise performance (ex.—phase noise being noise added during frequency conversion, analog-to-digital conversion, digital-to-analog conversion, etc.). An oscillator (ex.—oscillator circuit) typically includes an electromechanical resonator (ex.—quartz resonator, ceramic resonator, surface acoustic wave (SAW) resonator, microelectromechanical system (MEMS) resonator, nanoelectromechanical system (NEMS) resonator) and a feedback circuit, the feedback circuit being connected to the resonator and being configured for amplifying and perpetuating oscillation. Due to their mechanical nature, resonators are highly susceptible to mechanical vibration. The mechanical vibration often appears as a sidetone spur on the reference output offset by the vibrating frequency. The embodiments of the invention disclosed herein may provide a solution for handling interference in oscillator circuits caused by mechanical vibration.

Figure 1:
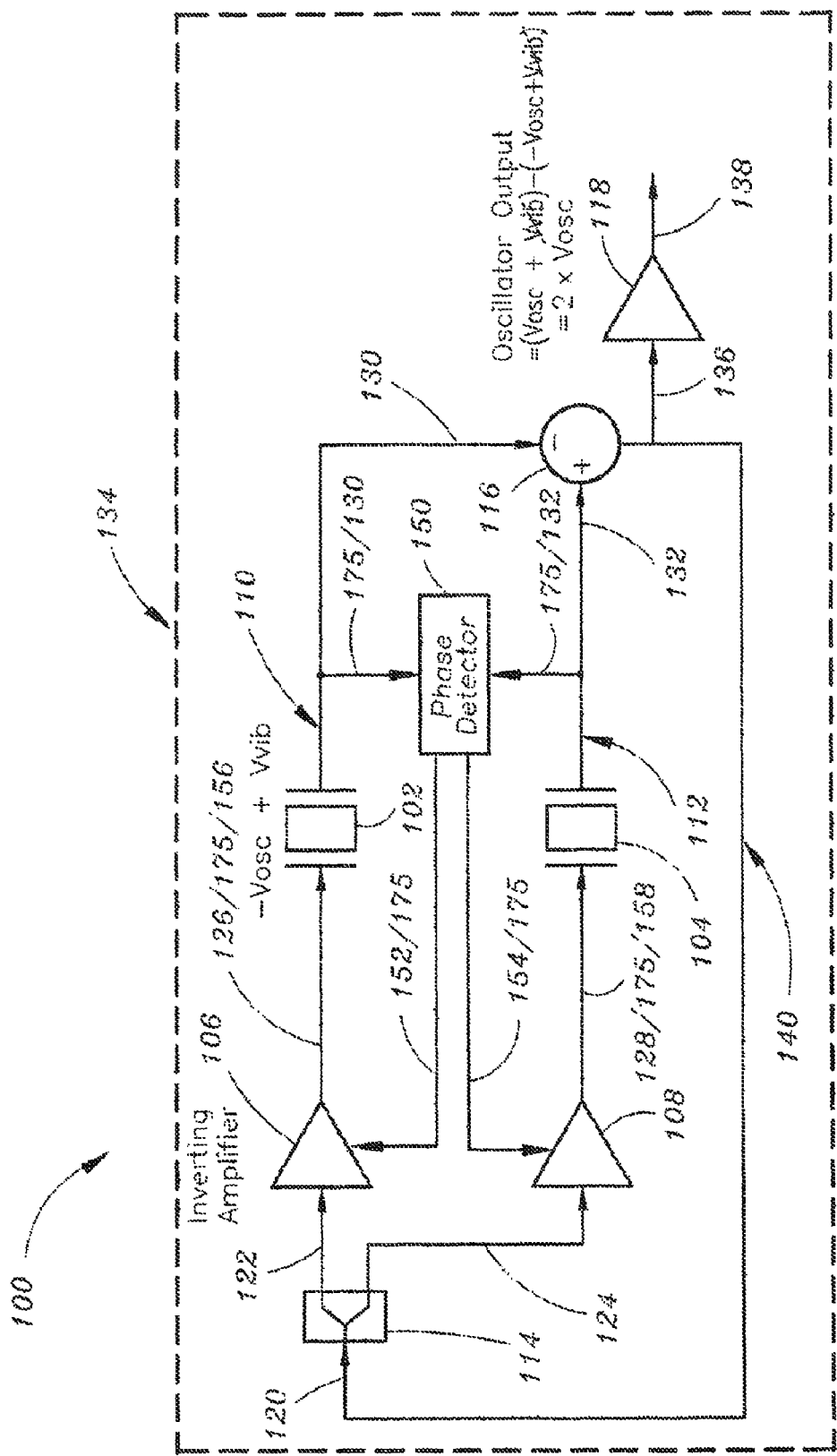
FIG. 1 is a block diagram of an oscillator in accordance with an exemplary embodiment of the present invention, wherein the oscillator is shown as being connected to a printed circuit board.

Referring to FIG. 1, an oscillator (ex.—a reference oscillator, a crystal oscillator, an oscillator circuit, an electronic oscillator circuit, electronic oscillator) 100 in accordance with an exemplary embodiment of the present disclosure is shown. The oscillator 100 may be an electronic circuit configured for producing output signals (ex.—oscillator output signals, repetitive electronic signal(s), sine waves, square waves, etc.). Further, the oscillator 100 may be configured for implementation in electronic devices, such as radio systems (ex.—narrowband radios, ARC-210 radio systems, Very High Frequency (VHF) Air Traffic Control radio systems) and navigation systems (ex.—Global Positioning System (GPS) systems).

In embodiments of the present disclosure, the oscillator 100 may include a first resonator 102 and a second resonator 104. For instance, the resonators (102, 104) may be mechanical or electromechanical devices (ex.—quartz resonators, ceramic resonators, SAW resonators, MEMS resonators, NEMS resonators, crystals formed of piezoelectric materials, quartz crystals). In further embodiments, the resonators (102, 104) may be formed (ex.—cut) in any one of a number of various shapes. For example, the resonators (102, 104) may be formed as rectangular-shaped plates.

In exemplary embodiments of the present disclosure, the oscillator 100 may further include a first amplifier 106 and a second amplifier 108. The first amplifier 106 may be connected to the first resonator 102, the first amplifier 106 and first resonator 102 being connected along (ex.—as part of) a first circuit path (ex.—a first circuit chain) 110. Further, the second amplifier 108 may be connected to the second resonator 104, the second amplifier 108 and second resonator 104 being connected along (ex.—as part of) a second circuit path (ex.—a second circuit chain) 112. In current embodiments of the present disclosure, the first amplifier 106 may be an inverting amplifier.

In embodiments of the present disclosure, the oscillator 100 may further include a routing device (ex.—a router, a splitter) 114. The routing device 114 may be connected to the first amplifier 106 and the second amplifier 108. In further embodiments of the present disclosure, the oscillator 100 may further include a summer (ex.—a voltage summer) 116. The summer 116 may be connected to the resonators (102, 104) and the router 114. In still further embodiments, the oscillator 100 may include a third amplifier 118. The third amplifier 118 may be connected to the resonators (102, 104). In further embodiments, the third amplifier 118 may be a buffer amplifier.

In exemplary embodiments of the present disclosure, the summer 116 may be configured for providing an input signal (ex.—a voltage) 120 to the splitter 114. The splitter 114 may be configured for receiving the input signal 120 and providing (ex.—splitting the input signal 120 to provide) a first output signal 122 to the first amplifier (ex.—the inverting amplifier) 106 and a second output signal 124 to the second amplifier, the first output signal 122 and the second output signal 124 being based upon (ex.—derived from) the input signal 120.

In further embodiments, the first amplifier (ex.—inverting amplifier) 106 may be configured for receiving the first output signal 122 via the splitter 114, while the second amplifier 108 may be configured for receiving the second output signal 124 via the splitter 114. In exemplary embodiments, the amplifiers (106, 108) may be configured for altering (ex.—increasing amplitude(s) of, amplifying) the received signals (122, 124). In still further embodiments, the amplifiers (106, 108) may be further configured for providing (ex.—outputting) the amplified signals as amplifier outputs (ex.—amplifier output signals). For example, the first amplifier (ex.—inverting amplifier) 106 may be configured for providing a first amplifier output signal 126 to the first resonator 102, the first amplifier output signal 126 being based upon (ex.—derived from) the first output signal 122. Further, the second amplifier 108 may be configured for providing a second amplifier output signal 128 to the second resonator 104, the second amplifier output signal 128 being based upon (ex.—derived from) the second output signal 124. The inverting amplifier 106 may be configured for utilizing negative feedback for inverting and amplifying a voltage.

In embodiments of the present disclosure, the resonators (102, 104) of the oscillator 100 may be configured for naturally oscillating at some frequencies (ex.—their resonant frequencies) with greater amplitude than at other frequencies. For example, the first amplifier output signal (ex.—voltage signal) 126 may cause the first resonator 102 to oscillate at the first resonator's resonant frequencies, and the second amplifier output signal (ex.—voltage signal) 128 may cause the second resonator 104 to oscillate at the second resonator's resonant frequencies. In exemplary embodiments of the present disclosure, the resonators (102, 104) may have a same set of (or may have some shared) resonant frequencies. In the embodiment illustrated in FIG. 1, the resonators (102, 104) are matched resonators which are driven at a same resonant frequency, one hundred-eighty degrees out-of-phase.

In exemplary embodiments of the present disclosure, the oscillation of the first resonator 102 may generate a first resonator output signal (ex.—voltage signal) 130. Further, the oscillation of the second resonator 104 may generate a second resonator output signal (ex.—voltage signal) 132. The first resonator output signal 130 may include a voltage component ($-V_{osc}$) (ex.—an oscillation signal component, a desired component) and a vibration noise component ($V_{vib}$). The second resonator output signal 132 may include a voltage component ($V_{osc}$) (ex.—an oscillation signal component, a desired component) and a vibration noise component ($V_{vib}$). In embodiments of the present disclosure, the resonators (102, 104), the amplifiers (106, 108, 118), the splitter 114 and/or the summer 116 may be connected to a printed circuit board (PCB) 134. In further embodiments, rather than a PCB, the resonators (102, 104), the amplifiers (106, 108, 118), the splitter 114 and/or the summer 116 may be connected to other surfaces for mounting and/or connecting components, such as multiple circuit boards with a common carrier plate, a package module, such as a Monolithic Microwave Integrated Circuit (MMIC) or hybrid, or an integrated circuit. For instance, the resonators (102, 104) may be placed in a same plane of the printed circuit board 134. Still further, the resonators (102, 104) may be located adjacent to each other, therefore, the vibration noise (ex.—vibration interference, mechanical vibration, vibration noise component, vibration) experienced by the resonators (102, 104) may be the same or similar. Thus, in each of the paths (110, 112), the vibration noise is present (ex.—common mode interference).

In further embodiments, the first resonator output signal 130 and the second resonator output signal 132 may be provided from the resonators (102, 104) to the summer 116. Further, the summer 116 may be configured for providing (ex.—generating) an oscillator output signal 136 based upon (ex.—derived from) the first resonator output signal 130 and the second resonator output signal 132. For instance, a difference between the first resonator output signal 130 and the second resonator output signal 132 may be determined (as shown in FIG. 1) when obtaining (ex.—deriving, generating) the oscillator output signal. In exemplary embodiments, when the matched resonators (102, 104) are driven one hundred-eighty degrees out-of-phase (ex.—with respect to each other), and when the vibration noise components of the first resonator output signal 130 and the second resonator output signal 132 are of a same magnitude (as described above), the vibration noise components will cancel out, thus eliminating a vibration noise component (ex.—vibration interference) from the oscillator output signal 136. Further, the oscillation signal components from each of the resonator output signals (130, 132) may be included in the oscillator output signal 136.

In embodiments of the present disclosure, the oscillator output signal 136 may be provided from the summer 116 to the third amplifier (ex.—the buffer amplifier) 118. The buffer amplifier 118 may be configured for increasing an amplitude of (ex.—amplifying) the received oscillator output signal 136 and for providing (ex.—outputting) the amplified oscillator output signal as a buffer amplifier output signal 138. In further embodiments, the buffer amplifier 118 may be configured for being connected to a load, and may be configured for isolating the resonators (102, 104) from the load. For instance, the buffer amplifier 118 may prevent the load (ex.—the load on the oscillator 100) from loading the resonators (102, 104), thereby preventing the load from pulling the resonance off-frequency.

In exemplary embodiments of the present disclosure, the oscillator output signal 136 may further be provided from the summer 116 to the resonators (102, 104) via a feedback loop 140 of the oscillator 100. For example, the following sequence may take place: the oscillator output signal 136 may be directed from the summer 116 to the splitter 114; the splitter 114 may then split the oscillator output signal 136 into multiple oscillator output signals and provide them to amplifiers (106, 108); the amplifiers (106, 108) may amplify the oscillator output signals and provide them to the resonators (102, 104); the resonators (102, 104) may then generate further resonator output signals derived from the amplified oscillator output signals and the oscillator may then generate further oscillator output signals derived from the resonator output signals, and the process may go on in such manner as described herein in a sustained (ex.—repeated) fashion. In further embodiments, the amplifiers (106, 108 and/or 118) may be configured to provide enough gain to allow the resonators (102, 104) to sustain oscillation.

In further embodiments of the present disclosure, the oscillator 100 may include a phase detector 150. The phase detector 150 may be connected (ex.—communicatively coupled with) the first circuit chain 110, the second circuit chain 112, the amplifiers (106, 108) and the resonators (102, 104), thereby forming a phase lock loop 175. The phase detector 150 may be configured for receiving (ex.—sampling) the first and second resonator output signals (130, 132) from the resonators (102, 104). The phase detector 150 may be further configured for comparing a phase of the first resonator output signal 130 to a phase of the second resonator output signal 132. Based on the comparing, the phase detector 150 is further configured for sending control signal(s) (152, 154) to the amplifier(s) (106, 108) for controlling gain and phase of the amplifier(s) and for controlling a relative phase of the resonators (102, 104). For example, the control signal(s) (152, 154) may be provided to the amplifier(s) (106, 108) and the amplifier(s) may provide control output signal(s) (156, 158), which are based upon/derived from the control signal(s) (152, 154), for causing the resonators (102, 104) to become and/or to remain locked one-hundred-eighty degrees out-of-phase with respect to each other.

Figure 2:
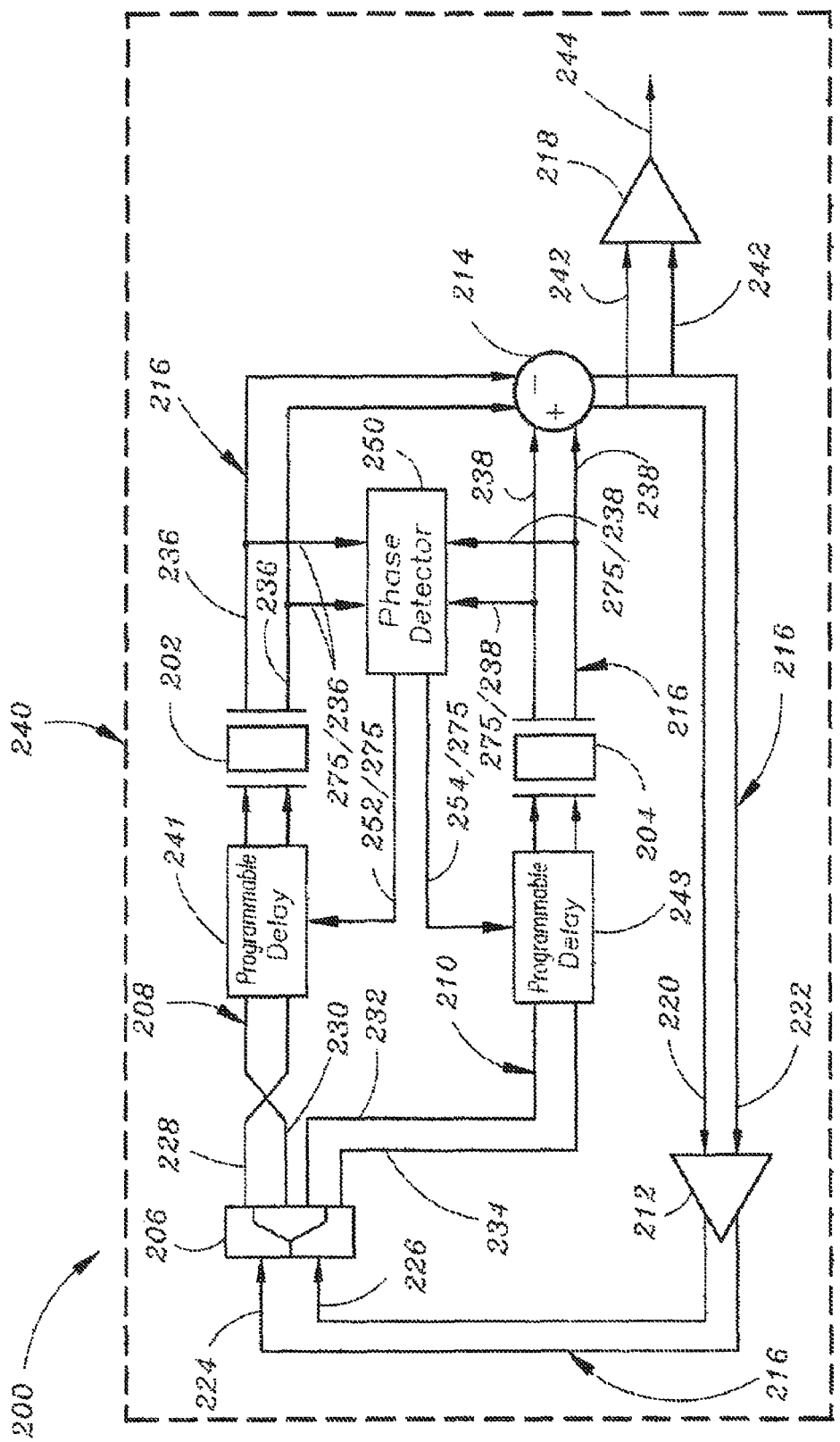
FIG. 2 is a block diagram of an oscillator in accordance with a further exemplary embodiment of the present invention, wherein the oscillator is shown as being connected to a printed circuit board.

Referring to FIG. 2, an oscillator (ex.—a reference oscillator, a crystal oscillator, an oscillator circuit, an electronic oscillator circuit, electronic oscillator) 200 in accordance with a further exemplary embodiment of the present disclosure is shown. The oscillator 200 may be an electronic circuit configured for producing output signals (ex.—oscillator output signals, repetitive electronic signal(s), sine waves, square waves, etc.). Further, the oscillator 200 may be configured for implementation in electronic devices, such as radio systems (ex.—narrowband radios, ARC-210 radio systems, Very High Frequency (VHF) Air Traffic Control radio systems) and navigation systems (ex.—Global Positioning System (GPS) systems).

In embodiments of the present disclosure, the oscillator 200 may include a first resonator 202 and a second resonator 204. For instance, the resonators (202, 204) may be mechanical or electromechanical devices (ex.—quartz resonators, ceramic resonators, SAW resonators, MEMS resonators, NEMS resonators, crystals formed of piezoelectric materials, quartz crystals). In further embodiments, the resonators (202, 204) may be formed (ex.—cut) in any one of a number of various shapes. For example, the resonators (202, 204) may be formed as rectangular-shaped plates.

In exemplary embodiments of the present disclosure, the oscillator 200 may further include a routing device (ex.—a router, a splitter) 206. The routing device 206 may be connected to the first resonator 202 via a first set of transmission lines 208 (ex.—a first set of circuit paths). Further, the routing device 206 may be connected to the second resonator 204 via a second set of transmission lines (ex.—a second set of circuit paths) 210.

In embodiments of the present disclosure, the oscillator 200 may further include a first amplifier 212. The first amplifier 212 may be connected to the routing device 206. In further embodiments, the oscillator 200 may further include a summer 214. The summer 214 may be connected to the first amplifier 212, the router 206 and the resonators (202, 204) via a feedback loop (ex.—feedback loop circuit) 216 of the oscillator 200. In further embodiments, the oscillator 200 may include a second amplifier 218. The second amplifier 218 may be connected to the resonators (202, 204). In further embodiments, the second amplifier 218 may be a buffer amplifier.

In exemplary embodiments of the present disclosure, the summer 214 may be configured for providing a first input signal (ex.—voltage) 220 and a second input signal 222 to the first amplifier 212. The first amplifier 212 may be configured for increasing amplitude(s) of (ex.—amplifying) the input signals (220, 222). Further, the first amplifier 212 may be configured for providing (ex.—outputting) the amplified signals as amplifier output signals. For instance, the first amplifier 212 may be configured for providing a first amplifier output signal 224 and a second amplifier output signal 226 to the splitter 206. The splitter 206 may be configured for receiving the amplifier output signals (224, 226) and providing (ex.—splitting the first amplifier output signal 224 to provide) a first output signal 228 and a second output signal 230 to the first resonator 202, and further providing (ex.—splitting the second amplifier output signal 226 to provide) a third output signal 232 and a fourth output signal 234 to the second resonator 204, the first and second output signals (228, 230) being based upon (ex.—derived from) amplifier output signal 224, the third and fourth output signals (232, 234) being based upon (ex.—derived from) amplifier output signal 226.

In embodiments of the present disclosure, the oscillator 200 may be a differential oscillator 200. Further, rather than implementing an inverting amplifier (such as the oscillator 100 shown in FIG. 1), the oscillator 200 shown in FIG. 2 may implement switching of the first set of transmission lines 208 for achieving inversion.

In further embodiments of the present disclosure, the resonators (202, 204) of the oscillator 200 may be configured for naturally oscillating at some frequencies (ex.—their resonant frequencies) with greater amplitude than at other frequencies. For example, the first and second output signals (228, 230) may cause the first resonator 202 to oscillate at the first resonator's resonant frequencies, and the third and fourth output signals (232, 234) may cause the second resonator 204 to oscillate at the second resonator's resonant frequencies. In exemplary embodiments of the present disclosure, the resonators (202, 204) may have a same set of resonant frequencies. In the embodiment illustrated in FIG. 2, the resonators (202, 204) may be matched resonators which are driven at a same resonant frequency, one hundred-eighty degrees out-of-phase.

In exemplary embodiments of the present disclosure, the oscillation of the first resonator 202 may generate a first set of resonator output signals (ex.—voltage signals) 236. Further, the oscillation of the second resonator 204 may generate a second set of resonator output signals 238. The first set of resonator output signals 236 may include a voltage component ($-V_{osc}$) (ex.—an oscillation signal component, a desired component) and a vibration noise component ($V_{vib}$). The second set of resonator output signals 238 may include a voltage component ($V_{osc}$) (ex.—an oscillation signal component, a desired component) and a vibration noise component ($V_{vib}$). In embodiments of the present disclosure, the resonators (202, 204), the amplifiers (212, 218), the splitter 206 and/or the summer 214 may be connected to a printed circuit board (PCB) 240. For instance, the resonators (202, 204) may be placed in a same plane of the printed circuit board 240. Still further, the resonators (202, 204) may be located adjacent to each other, therefore, the vibration noise (ex.—vibration interference, mechanical vibration, vibration noise component, vibration) experienced by the resonators (202, 204) may be the same or similar. Thus, in each set of circuit paths (208, 210), the vibration noise is present (ex.—common mode interference).

In further embodiments, the first and second sets of resonator output signals (236, 238) may be provided from the resonators (202, 204) to the summer 214. Further, the summer 214 may be configured for providing (ex.—generating) oscillator output signals 242 based upon (ex.—derived from) the first set of resonator output signals 236 and the second set of resonator output signals 238. In exemplary embodiments, when the matched resonators (202, 204) are driven one hundred-eighty degrees out-of-phase (ex.—with respect to each other), and when the vibration noise components of the first set of resonator output signals 236 and the second resonator output signal 238 are of a same magnitude (as described above), the vibration noise components will cancel out, thus eliminating a vibration noise component (ex.—vibration interference) from the oscillator output signals 242. Further, the oscillation signal components from the sets of resonator output signals (236, 238) may be included in the oscillator output signals 242.

In embodiments of the present disclosure, the oscillator output signals 242 may be provided from the summer 214 to the second amplifier (ex.—the buffer amplifier) 218. The buffer amplifier 218 may be configured for increasing an amplitude of (ex.—amplifying) the received oscillator output signal(s) 242 and for providing (ex.—outputting) the amplified oscillator output signal(s) as buffer amplifier output signal(s) 244. In further embodiments, the buffer amplifier 218 may be configured for being connected to a load, and may be configured for isolating the resonators (202, 204) from the load. For instance, the buffer amplifier 218 may prevent the load (ex.—the load on the oscillator 200) from loading the resonators (202, 204), thereby preventing the load from pulling the resonance off-frequency.

In exemplary embodiments of the present disclosure, the oscillator output signals 242 may further be provided from the summer 214 to the resonators (202, 204) via the feedback loop circuit 216 of the oscillator 200. For example, the following sequence may take place: the oscillator output signals 242 may be directed from the summer 214 to the first amplifier 212; the first amplifier 212 may then amplify the oscillator output signals and provide the amplified oscillator output signals to the splitter 206; the splitter 206 may then split the amplified oscillator output signals into multiple amplified oscillator output signals and may provide them to the resonators (202, 204); the resonators (202, 204) may then generate further resonator output signals, derived from the amplified oscillator output signals, and the oscillator 200 may then generate further oscillator output signals derived from the resonator output signals, and the process may go on in such manner as described herein in a sustained (ex.—repeated) fashion. In further embodiments, the amplifiers (212 and/or 218) may be configured to provide enough gain to allow the resonators (202, 204) to sustain oscillation.

For the oscillator 200 shown in FIG. 2, the extent to which the resonators (202, 204) are matched may determine the extent to which vibration interference may be suppressed. In embodiments of the present disclosure, adding a trim option for phase and amplitude to one of the circuit paths (208, 210) may account for resonator differences and may improve vibration noise suppression.

In further embodiments of the present disclosure, the oscillator 200 may include a first delay circuit (ex.—a first programmable delay) 241 and a second delay circuit (ex.—a second programmable delay) 243. The first programmable delay circuit 241 may be connected to (ex.—communicatively coupled with) the first set of circuit paths 208, the splitter 206 and the first resonator 202. The second programmable delay circuit 243 may be connected to (ex.—communicatively coupled with) the second set of circuit paths 210, the splitter 206 and the second resonator 204. In still further embodiments of the present disclosure, the oscillator 200 may include a phase detector 250. The phase detector 250 may be connected (ex.—communicatively coupled with) the resonators (202, 204), the programmable delays (241, 243), and the feedback loop circuit 216, thereby forming a phase lock loop 275. The phase detector 250 may be configured for receiving (ex.—sampling) the sets of resonator output signals (236, 238) from the resonators (202, 204). The phase detector 250 may be further configured for comparing a phase of the first set of resonator output signals 236 to a phase of the second set of resonator output signal 238. Based on the comparing, the phase detector 250 is further configured for sending control signal(s) (252, 254) to the programmable delay(s) (241, 243) for controlling a relative phase of the resonators (202, 204). For example, the control signal(s) (252, 254) may be provided to the programmable delay(s) (241, 243) and the programmable delay(s) (241, 243) may provide delay output(s) (245, 247) which are based upon/derived from the control signals (252, 254), for causing the resonators (202, 204) to become and/or to remain locked one-hundred-eighty degrees out-of-phase with respect to each other.

Figure 3:
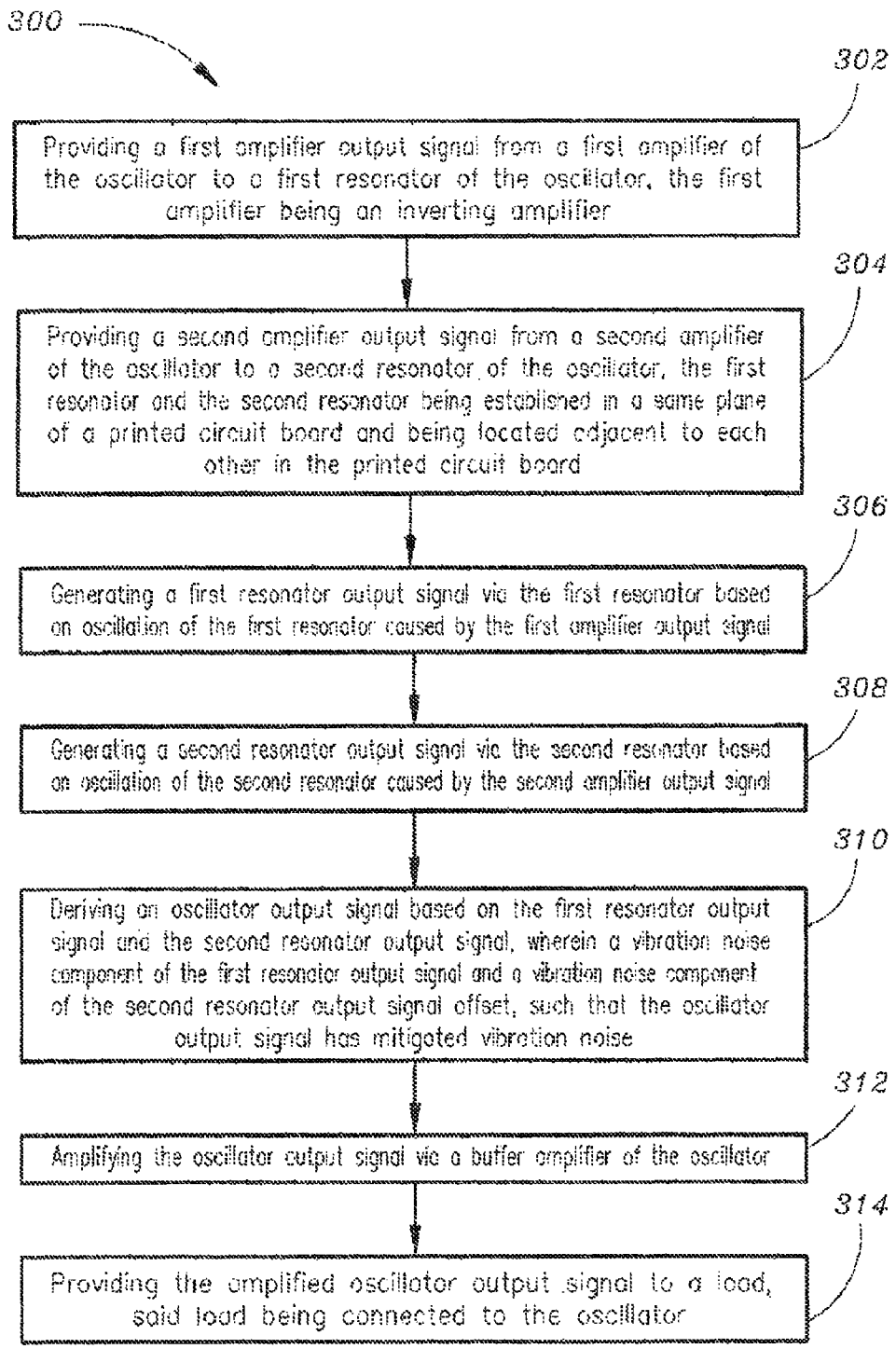
FIG. 3 depicts a flow chart illustrating a method for providing a mitigated vibration noise output signal via an oscillator in accordance with an exemplary embodiment of the present invention.

Referring to FIG. 3, a flowchart illustrating a method for providing output signal(s) via an oscillator (such as by implementing an embodiment of the oscillator 100 described above), the oscillator output signals having mitigated vibration noise in accordance with an exemplary embodiment of the present invention, is shown. The method 300 may include the step of providing a first amplifier output signal from a first amplifier of the oscillator to a first resonator of the oscillator, the first amplifier being an inverting amplifier 302. The method 300 may further include the step of providing a second amplifier output signal from a second amplifier of the oscillator to a second resonator of the oscillator 304, the first resonator and the second resonator being established in a same plane of a printed circuit board and being located adjacent to each other in the printed circuit board.

The method 300 may further include the step of generating a first resonator output signal (ex.—voltage signal) via the first resonator based on oscillation of the first resonator caused by the first amplifier output signal 306. The method 300 may further include the step of generating a second resonator output signal (ex.—voltage signal) via the second resonator based on oscillation of the second resonator caused by the second amplifier output signal 308. The method 300 may further include the step of deriving an oscillator output signal based on the first resonator output signal and the second resonator output signal 310, wherein a vibration noise component of the first resonator output signal and a vibration noise component of the second resonator output signal offset, such that the oscillator output signal has mitigated vibration noise. The method 300 may further include amplifying the oscillator output signal via a buffer amplifier of the oscillator 312. The method 300 may further include providing the amplified oscillator output signal to a load, said load being connected to the oscillator 314.

In further embodiments, the method 300 may further include the step of receiving the first and second resonator output signals at a phase detector of the oscillator 316. The method 300 may further include the step of comparing a phase of the first resonator output signal to a phase of the second resonator output signal via the phase detector 318. The method 300 may further include the step of, based on the comparing, providing at least one control signal to at least one of the first amplifier and the second amplifier for controlling gain and phase of the first amplifier and/or second amplifier and for controlling a relative phase of the resonators 320. The method 300 may further include, in response to receiving the at least one control signal, providing at least one control output signal (the control output signal(s) being based upon/derived from the control signal(s)) from at least one of the first amplifier and the second amplifier to the at least one of the first resonator and the second resonator for causing the first and second resonators to at least one of: become locked one-hundred eighty degrees out-of-phase with respect to each other or remain locked one-hundred eighty degrees out-of-phase with respect to each other 322.

The vibration noise mitigation approaches described herein may provide an inexpensive and easily implementable solution for reducing g-sensitivity of many oscillator designs.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An oscillator, comprising:
   a first amplifier, the first amplifier being configured for outputting a first amplifier output signal and a second amplifier output signal;
   a routing device, the routing device being connected to the first amplifier and being configured for receiving the first and second amplifier output signals, the routing device configured for splitting the first amplifier output signal to provide a first routing device output signal and a second routing device output signal, the routing device further configured for splitting the second amplifier output signal to provide a third routing device output signal and a fourth routing device output signal;
   a first resonator, the first resonator being connected to the routing device via a first set of transmission lines, the first resonator being configured for receiving the first and second routing device output signals, the first and second routing device output signals causing the first resonator to oscillate and to generate a first resonator output signal; and
   a second resonator, the second resonator being connected to the routing device via a second set of transmission lines, the second resonator being configured for receiving the third and fourth routing device output signals, the third and fourth routing device output signals causing the second resonator to oscillate and to generate a second resonator output signal,
   wherein the oscillator is a differential oscillator and implements switching of the first set of transmission lines for providing inversion, the first resonator and the second resonator being driven at a same frequency and one hundred-eighty degrees out-of-phase with respect to each other.

2. An oscillator as claimed in claim 1, wherein the first resonator and the second resonator are connected to a printed circuit board and are located adjacent to each other in a same plane of the printed circuit board.

3. An oscillator as claimed in claim 1, wherein the first resonator output signal and the second resonator output signal each include an oscillation signal component and a vibration noise component.

4. An oscillator as claimed in claim 3, wherein the oscillator generates an oscillator output signal derived from the first resonator output signal and the second resonator output signal.

5. An oscillator as claimed in claim 4, wherein the vibration noise components of the first resonator output signal and the second resonator output signal are equal in magnitude and cancel each other, thereby allowing the oscillator output signal to be free of vibration interference.

6. An oscillator as claimed in claim 5, further comprising:
   a second amplifier, the second amplifier being connected to the resonators, the second amplifier being a buffer amplifier and being configured for amplifying the oscillator output signal and preventing a load on an output of the oscillator from loading the resonators, thereby preventing the load on the oscillator from pulling resonance of the oscillator off-frequency.

7. An oscillator as claimed in claim 6, wherein the oscillator output signal is amplified and fed back to the resonators via a feedback circuit of the oscillator.

8. An oscillator as claimed in claim 1, further comprising:
a summer, the summer being connected to the first amplifier, the summer being configured for providing input signals to the first amplifier, the first amplifier configured for amplifying the input signals to generate the first and second amplifier output signals.

9. An oscillator as claimed in claim 1, further comprising:
a first programmable delay circuit, the first programmable delay circuit being connected to the splitter and the first resonator;

a second programmable delay circuit, the second programmable delay circuit being connected to the splitter and the second resonator; and a phase detector, the phase detector being connected to the resonators, and the programmable delay circuits wherein the phase detector is configured for: receiving the first resonator output signal and the second resonator output signal; comparing a phase of the first resonator output signal to a phase of the second resonator output signal; based on said comparing, providing at least one control signal to at least one of the first programmable delay circuit and the second programmable delay circuit for causing the resonators to be maintained one hundred-eighty degrees out-of-phase with respect to each other.

\* \* \* \* \*